United States Patent [19]

Chirovsky et al.

[11] Patent Number: 5,289,015
[45] Date of Patent: Feb. 22, 1994

[54] PLANAR FET-SEED INTEGRATED CIRCUITS

[75] Inventors: Leo M. F. Chirovsky, Bridgewater; Lucian A. D'Asaro, Madison; Shin-Shem Pei, New Providence; Ted K. Woodward, Lincroft, all of N.J.

[73] Assignee: AT&T Bell Laboratories, Murray Hill, N.J.

[21] Appl. No.: 785,670

[22] Filed: Oct. 31, 1991

Related U.S. Application Data

[63] Continuation-in-part of Ser. No. 691,181, Apr. 25, 1991.

[51] Int. Cl.$^5$ ............................................. H01L 27/14
[52] U.S. Cl. .................................... 257/21; 257/257; 257/280; 257/523
[58] Field of Search ................ 257/21, 257, 258, 272, 257/280, 523

[56] References Cited

U.S. PATENT DOCUMENTS 4,884,119  11/1989  Miller ..................................... 357/58

OTHER PUBLICATIONS

Miller, "Quantum Well Optoelectronic Switching Devices", *International Journal of High Speed Electronics*, vol. 1, No. 1, pp. 19–46 (1990).
Anholt et al., "Ion implantation into gallium arsenide", *Journal of Appl. Phys.*, vol. 64, pp. 3429–3438 (1988).
Pearton, "Ion Implantation for Isolation of III–V Semiconductors", *Materials Science Reports*, vol. 4, pp. 315–367 (1990).
Chirovsky, et al. "Large Arrays of Symmetric Self-Electro-Optic Effect Devices", *OSA Proceedings on Photonic Switching*, H. S. Hinton and J. W. Goodman, eds. (Optical Society of America, Washington, D.C. 1991) 8, 56.
McCormick, et al. "S-SEED-Based Photonic Switching Network Demonstration", *OSA Proceedings on Photonic Switching, H. S. Hinton and J. W. Goodman, eds. (Optical Society of America, Washington, D.C. 1991) 8, 48.
D'Asaro, et al. "Buried Interconnect Structure for Symmetric SEEDs" in Advanced Processing and Characterization Technologies, P. H. Halloway, ed. (American Vac. Soc. Series 10, Conf. Proceedings No. 227, American Institute of Physics, N.Y. 1991) 192).
Miller et al. "Field-Effect Transistor Self-Electrooptic Effect Device: Integrated Photodiode, Quantum Well Modulator and Transistor" *IEEE Photonics Technology Letters*, vol. 1, No. 3 pp. 62–64 (1989).

*Primary Examiner*—William D. Larkins
*Attorney, Agent, or Firm*—Glen E. Books

[57] ABSTRACT

FETs and quantum well diodes are combined on the same semi-insulating substrate, while providing the FETs with protection from spurious voltages. A deeply buried P region in the semi-insulating substrate is partitioned by a high resistivity proton implanted region, to provide both the P region of the quantum well diode and an isolating buried P layer for the FETs.

7 Claims, 1 Drawing Sheet

PLANAR FET-SEED INTEGRATED CIRCUITS

CROSS-REFERENCE TO RELATED APPLICATION

This application is a continuation-in-part of the co-pending application Ser. No. 07/691181 filed Apr. 25, 1991 by L. M. F. Chirovsky and L. A. D'Asaro, entitled Planar Self-Electro-Optical Device and assigned to applicants' assignee.

FIELD OF THE INVENTION

This invention relates to optoelectronic devices and, in particular, to optoelectronic devices comprising the integration of quantum well diodes and field effect transistors (FETs) on a single substrate to form FET-SEED integrated circuits.

BACKGROUND OF THE INVENTION

FET-SEED integrated circuits offer considerable promise in optoelectronic processing, particularly for use in optoelectronic switches. SEEDs, because of the low energy requirements of their quantum well components, can receive optical inputs and provide optical outputs with a high degree of efficiency. They can be combined in simple circuits with minimal conductive paths, parasitic capacitance and line termination problems. For a survey of SEED devices and their applications, see D. A. B. Miller, "Quantum Well Optoelectronic Switching Devices," *International Journal of High Speed Electronics*, Vol. 1, No. 1, pp. 19-46 (1990).

One shortcoming of SEEDs for use in optoelectronic switching is the dependence of switching speed on the laser power level. In a large scale switching system the laser power provided to a large array of SEEDs may be subdivided by thousands in order to power each SEED in the array. Moreover, optical loss in spot generation further reduces the optical input power. Hence to achieve needed speeds in the range of hundreds of megabits per second, it is necessary to amplify the electrical signal from the quantum well receiving diode before applying the amplified signal to the input of the quantum well modulation diode.

While the FET is a good candidate for integration with quantum well diodes to form FET-SEED integrated circuits, integration which achieves high performance in both the FETs and the quantum well diodes without degrading the performance of one or the other must overcome a number of difficulties. For example, typical prior art quantum well diodes utilize a mesa structure presenting a difficult topography for defining FET gate regions with high precision. Moreover ideal FET channel layers often are highly optically absorbing and extension of such layers over optically sensitive diode regions can degrade diode performance. Furthermore FETs are voltage sensitive and the semi-insulating layers used in the fabrication of quantum well diodes permit the build up and lateral spread of spurious voltages which can degrade FET performance.

Contemplated electrooptic switching applications comprising large arrays of FETs and SEEDs require high performance components. The SEEDs must operate at hundred megabit speeds with low optical power, and the FETs must control source to drain voltages on the order of 10 V but must completely switch with a low magnitude threshold voltage on the order of $-0.5$ V in order to minimize the number of reference voltage leads.

SUMMARY OF THE INVENTION

Applicants have discovered a structure and method for fabricating FETs and quantum well diodes on the same semi-insulating substrate while providing the FET with enhanced protection from spurious voltages. The structure uses a deeply buried p-layer in a semi-insulating substrate partitioned to isolate the FET portion of the substrate. The same buried p-layer can be partitioned to provide the p-regions of quantum well diodes.

BRIEF DESCRIPTION OF THE DRAWINGS

The advantages, nature and various additional features of the invention will appear more fully upon consideration of the illustrative embodiments now to be described in detail in connection with the accompanying drawings. In the drawings.

It is to be understood that these drawings are for purposes of illustrating the concepts of the invention and are not to scale.

DETAILED DESCRIPTION

Figure 1:
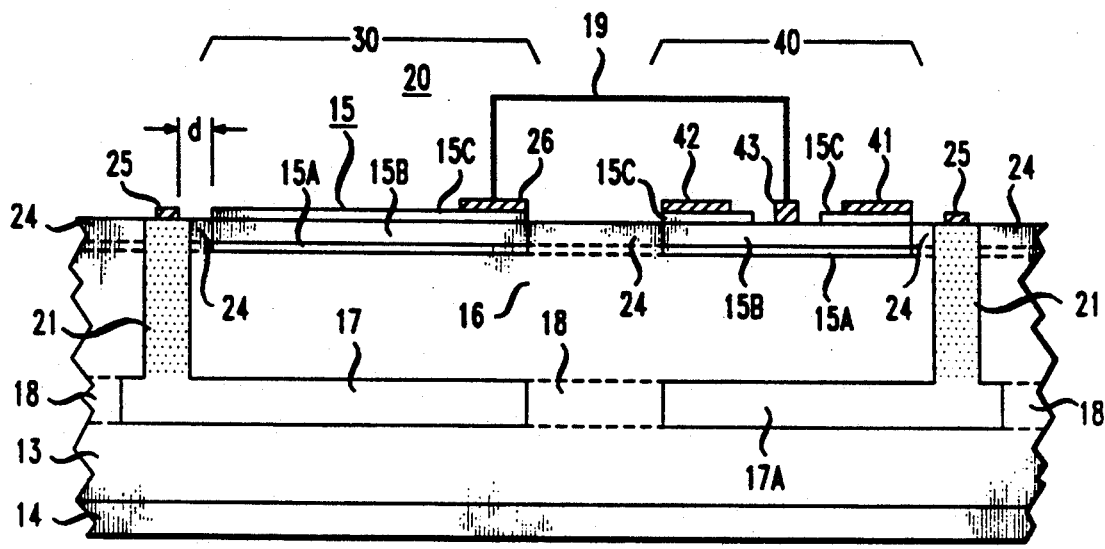
FIG. 1 is a schematic cross section of an integrated FET-SEED device in accordance with the invention.

Referring to the drawings, FIG. 1 is a schematic cross section of a representative portion of a FET-SEED integrated circuit showing both a quantum well diode 30 and a FET 40. The quantum well diode 30 is formed over a reflector stack 13 on a substrate 14 of semi-insulating semiconductor. In essence the quantum well diode comprises a top composite layer 15 of n-doped semiconducting material, an intrinsic quantum well region 16 and an underlying buried layer 17 of p-doped semiconducting material. Composite layer 15 preferably comprises a bottom layer 15A of n+ semiconductor, a semi-insulating spacer layer 15B and an n+ cap layer 15C. Contact with the buried p-layer 17 is preferably via implanted p-regions 21.

The p-layer 17 is buried in the substrate beneath the quantum well region 16. Since the quantum well region 16 typically has a thickness in excess of a micrometer, the p-layer 17 is typically buried at least a micrometer from the uppermost continuous semiconductor surface. Preferably the buried p-layer extends laterally beuond the edge of the active region of the diode so that contact with the buried p-layer can be laterally displaced from the active region by a distance d exceeding a micrometer.

The order of the diode layers is inverted as compared with typical prior art diodes in order that implanted contacts 21 can be made to buried layer 17. The p-type dopant Be is sufficiently light that it can be implanted to a sufficient depth (typically exceeding a micron) to make contact with buried layer 17. N-type dopants, in contrast, are all heavier elements that could not be implanted to sufficient depth. The p-layer 17 is advantageously configured and partitioned by proton implantation regions 18 in order to provide desired isolation.

The FET 40 advantageously overlies quantum well region 16. A portion of composite layer 15 is used as the FET channel, and a portion 17A of p-layer 17 underlies FET 40 to protect the FET from spurious voltages. Specifically, a portion of layer 15—configured and partitioned by etching and by fluorine implantation regions 24—is used as the FET channel and a portion 17A of p-layer 17, configured and partitioned by proton implantation, underlies the FET 40 and protects it from spurious voltages. Advantageously, each of the isolating partitioned portions of buried p-layer 17 can be contacted from the upper surface of the device via respective implanted contacts 21.

More specifically, FET 40 comprises a source metal contact 41, a drain metal contact 42, and a gate electrode 43. The channel comprises a portion of n+ layer 15A disposed under a portion of semi-insulating spacer layer 15B. To provide the source metal contact and drain metal contact with good ohmic contacts having low optical absorption, portions of n+ cap layer 15C are disposed between the metal contacts and spacer layer 15B. The n+ channel layer 15A can be n+ doped gallium arsenide. The spacer layer 15B can be undoped $Al_{0.11}Ga_{0.89}As$, and the cap layer 15C can be heavily n-doped GaAs. The composite channel structure has the advantage that spacer layer 15B enhances breakdown voltage and reduces the threshold voltage while keeping optical absorption at a low level. The source and drain metal contacts 41 and 42 are preferably NiGeAu. The gate electrode 43 is preferably TiPtAu.

It should be noted that the same structure as FET 40 with the gate electrode 43 omitted can be used as a resistor between contacts 41 and 42. The magnitude of the resistance in such a resistor is controlled by the length of the "channel".

Interconnections between the diode 30 and other components such as FET 40 are effected by a metallization layer 19 (schematically illustrated as a wire), leaving a window opening 20 for providing optical access to the diode. An antireflection coating (not shown) can be disposed over the upper surface to enhance optical efficiency.

The device of FIG. 1 is made of direct bandgap semiconductor such as a III-V semiconductor. In the preferred embodiment the substrate 14 is gallium arsenide, the buried p-layer 17 is p-doped aluminum gallium arsenide, the overlying quantum well region 16 comprises alternating layers of aluminum gallium arsenide and gallium arsenide, and the reflector stack 13 can be alternate layers of aluminum arsenide and aluminum gallium arsenide.

The advantages of FIG. 1 structure are manyfold. The buried p-layer 17A not only can be used to protect the FET 40 from spurious voltages, it also provides a means via an implanted contact 21 for applying a desired bias to 17A and thereby adjusting the threshold of the FET or even changing the FET from a depletion mode device to an enhancement mode device. Furthermore the structure provides surface contacts both to the n-region of quantum well diode 30 and, via an implanted contact 21, to the buried p-region of the diode. This access, combined with the ability to isolate devices by partitioning layers 15 and 17, permits enhanced flexibility in the design of integrated circuits. If desired, any of the four FET terminals can be connected to any of the two diode terminals.

Figure 2:
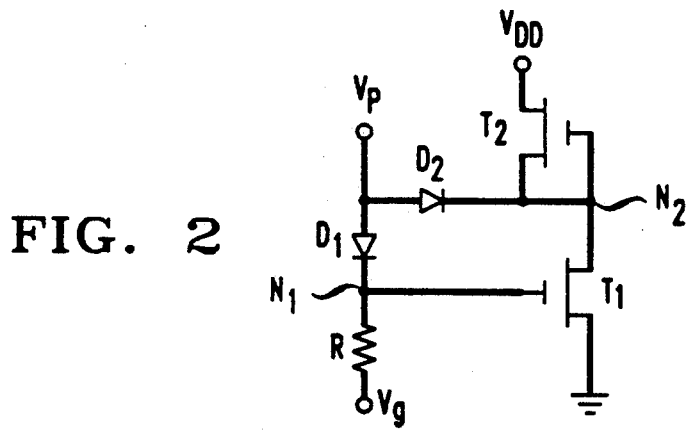
FIG. 2 is a schematic circuit diagram showing the interconnections in an exemplary FET-SEED integrated circuit.
Figure 3:
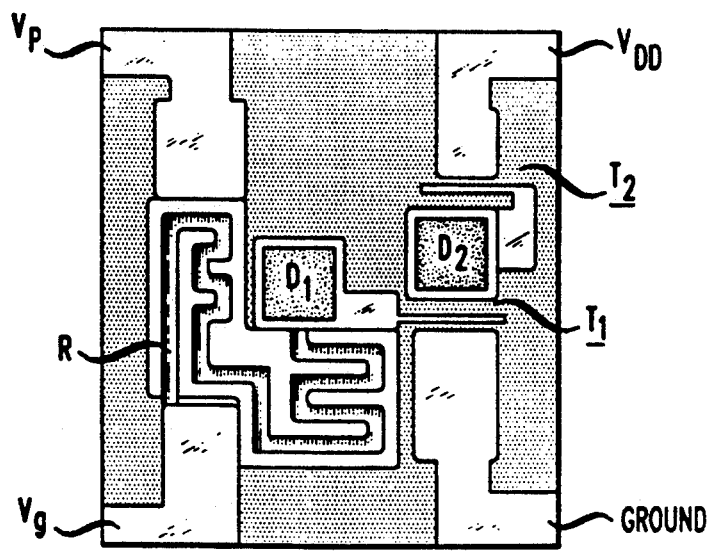
FIG. 3 is a plan view in elevation showing the preferred layout of components to achieve the circuit of FIG. 2.

The fabrication and structure of the invention can be understood in greater detail by consideration of the specific example shown in FIGS. 2 and 3. FIG. 2 is a schematic circuit diagram of an integrated FET-SEED device comprising two quantum wells $D_1$ and $D_2$, two FETs $T_1$ and $T_2$ and a resistor R. The preferred layout of the circuit is shown in FIG. 3. $V_p$ is a bias voltage in the range $-1$ to 0 volts applied to a common buried p-layer (17) shared $D_1$ and $D_2$. A bias voltage of about 10 volts is applied to $V_{DD}$ and the source of $T_1$ is grounded. With these voltages the device acts as an optical amplifier in that variations in the intensity of light applied to $D_1$ are amplified in the optical output of $D_2$.

In this implementation of FET-SEED integration, one quantum well diode $D_1$ acts as a photodetector and its photocurrent modulates the voltage of node $N_1$ connected to the gate of FET $T_1$. Small voltage swings on node $N_1$ then cause large voltage swings at node $N_2$ between $T_1$ and load FET $T_2$ which, in turn, are used to modulate diode $D_2$. The state of $D_2$ can be read out with a monitor laser beam (not shown). Hence the functions of the photodetector are separate from the modulator, in contrast with the previous SEED systems where the same device acts as a photodetector and a modulator. In this implementation, the switching at a given speed can be accomplished with weaker signals due to the amplification of the photocurrent. It is also significant that problems of saturation of the SEED at high light intensity do not occur since the switching of the modulator is accomplished by the input current of the FET's to the modulator, not by photocurrents. Thus lower light intensities can be used throughout. The power for the increased switching current is applied by an external electrical power supply.

The exemplary structure can be conveniently fabricated by using molecular beam epitaxy (MBE) to grow the layers for the reflector stack, the diode and the FET on a III-V semiconductor substrate.

The first step is to provide a substrate 14 of undoped gallium arsenide and to grow the layers for the reflector stack 13. The reflector stack is preferably grown as plural pairs of AlAs and $Al_xGa_{1-x}As$ layers topped with a relatively thicker layer of $Al_xGa_{1-x}As$. As a specific example, the stack can comprise 15 paired layers of AlAs having thickness 723 Å and $Al_{.11}Ga_{.89}As$ having thickness 599 Å. The top layer of $Al_{.11}Ga_{.89}As$ is undoped in order to keep dopants from the reflector layers and has thickness of a half wavelength, e.g. 1198 angstroms, in order to minimize interaction with light passing through.

The next step is to grow on the reflector stack the layers required for the quantum well diode 30 and the FET 40, including the buried p-layer 17, the quantum well structure 16, and upper n-layer 15. The buried p-layer 17 is preferably grown as a layer of p-doped $Al_xGa_{1-x}As$, and it can be a 3000 angstrom layer of $Al_{.11}Ga_{.89}As$ doped with p-impurities to a concentration of $5 \times 10^{18}$ cm$^{-3}$.

The quantum well structure 16 is preferably grown on the p-layer as a sandwich structure comprising a buffer layer of $Al_xGa_{1-x}As$, a series of alternating barrier layers ($Al_yGa_{1-y}As$) and well layers (GaAs), followed by an upper buffer layer. In the example, a buffer layer of 500 Å of undoped $Al_{.11}Ga_{.89}As$ is grown on the p-layer 17, followed by 71 pairs of 35 Å $Al_{.30}Ga_{.70}As$ and 100 Å GaAs. The upper buffer is 200 Å of undoped $Al_{.11}Ga_{.89}As$.

Over the quantum well region 16 is grown composite n-layer 15 comprising an n-type channel layer 15A which can be 100 Å of GaAs n-doped to a concentration $1 \times 10^{18}$ cm$^{-3}$, a spacer layer 15B which can be 900

Å of undoped $Al_{.11}Ga_{.89}As$ and an n-type cap layer 15C such as 600 Å of GaAs n-doped to $5 \times 10^{18} cm^{-3}$. The channel layer is so thin that optical absorption is minimal. The cap layer is so heavily doped that its optical absorption is minimal.

The next step is to provide electrical contact regions 21 to the buried p-layer 17, 17A. This is preferably accomplished by ion implantation of p-type impurities. The surface is covered with photoresist, windows are opened over the desired contact regions and p-type impurity such as Be is implanted at several implant energies to assure a conducting path from the surface to the buried layer. The Be is annealed by rapid thermal annealing. Details of this process are described in Anholt et al., "Ion Implantation Into Gallium Arsenide", *Journal of Applied Physics*, Vol. 64, p. 3429 (1988). Alternatively, contacts to the buried p-layer can be made by etching holes through the quantum well region 16 and depositing Au-Be in the holes.

After the implanted contacts to the buried p-layer are made, the next step is to form the isolation regions between various portions of n-layer 15 and between various portions of p-layer 17. For layer 15 isolation is effected by fluorine implant. The surface is covered with photoresist, windows are photolithographically opened over the regions 24 to be isolated and fluorine ions are implanted to render the regions semi-insulating. Similarly, for layer 17 the surface is again masked with windows opened over the regions 18 to be isolated, and protons (hydrogen ions) are implanted at several energies to compensate acceptors in the buried p-layer. Each implant is followed by a rapid thermal anneal to optimize the isolation. Details of isolation processes are set forth in Pearton, "Ion Implantation for Isolation of III-V Semiconductors", *Materials Science Reports*, Vol. 4, p. 315, (1990).

The next steps involve etching to define physically patterned components in composite layer 15 and metallization to provide electrical interconnection. Layer 15 is patterned, as by photolithographic etching, to remove the shallow cap layer 15C in the regions between different components. The FET gate region, however, as well as any resistors, are more precisely defined by plasma etching in Freon 12. The plasma is selective for GaAs relative to $Al_{.11}Ga_{.89}As$ interface. An overetch is deliberately used in order to undercut the GaAs cap and provide an overhang of the photoresist by a fraction of a micron. The overetch avoids shorts between the gate metal 43 (TiPtAu) and the n+cap layer.

The final steps concern depositing metal for ohmic contacts and interconnection. N-type ohmic contacts such as NiGeAu diode contacts 26, 41, 42 are made with the n-layer 15A and p-type ohmic contacts 25 such as Au-Be are made with contact regions 21. Thus both the n-layer and p-layer are contacted from the same surface. For final metallization insulating film (not shown) such as silicon nitride is deposited and patterned, and a metallic layer 19 such as successive layers of titanium, platinum and gold, is deposited over the insulating film in order to connect the components as shown in FIGS. 2 and 3.

A test device comprising a planar FET-SEED integrated circuit of the type shown in FIGS. 2 and 3 was made substantially as described above, except that all components shared a common p-layer 17 without implanted isolation regions. The FETs showed high transconductance of approximately 80 ms/mm, threshold voltage of $-0.5$ volts, a breakdown voltage of about 10 volts and a high cut off frequency greater than 10 gigahertz. The quantum well diodes were operated with a high contrast of 20:1 in a Fabry-Perot mode.

With minor modifications the circuit of FIGS. 2 and 3 can be altered to operate with differential optical inputs and outputs. This alteration can be accomplished by replacing resistor R with a quantum well receiving diode and adding a quantum well modulation diode in parallel with FET T2. The underlying p-layer 17 is partitioned, as described above, to isolate the separate components.

It is to be understood that the above-described embodiments are illustrative of only a few of the many possible specific embodiments of the invention. For example, while the invention has been described in the context of the preferred gallium arsenide materials system, other materials systems such as indium gallium arsenide, indium gallium arsenide phosphide and gallium antimonide can also be used. Thus numerous and varied other arrangements can be made by those skilled in the art without departing from the spirit and scope of the invention.

We claim:

1. A semiconductor integrated circuit of the type comprising: a) a quantum well reflecting stack, b) a buried p-layer of semiconductor overlying said reflector stack, c) a quantum well intrinsic region overlying said p-layer, d) an n-layer of semiconductor overlying said quantum well intrinsic region; e) an n-channel field effect transistor comprising a source, a gated n-channel and a drain overlying said quantum well intrinsic region and said buried p-layer; and f) a PIN quantum well diode comprised of portions said buried p-layer, said quantum well intrinsic region, and said n-layer, CHARACTERIZED IN THAT:

said buried p-layer is partitioned by a proton implanation region to separate the portion of said p-layer underlying said FET from the portion comprising the p-layer of said diode said proton implantion region being of high resistivity and containing crystal damage.

2. A semiconductor integrated circuit according to claim 1 wherein said buried p-layer is partitioned into a plurality of separated regions and further comprising means for electrically contacting each of a plurality of said partitioned regions from the surface overlying said quantum well intrinsic region.

3. A semiconductor integrated circuit according to claim 2 wherein said means for electrically contacting said partitioned regions comprise ion-implanted p-regions extending through said quantum well intrinsic region.

4. A semiconductor integrated circuit according to claim 1 wherein said n-layer is partitioned by fluorine implantation.

5. A semiconductor integrated circuit according to claim 1 further including a resistor comprising a portion of the n-layer disposed on said quantum well intrinsic region.

6. A semiconductor integrated circuit according to claim 1 wherein said reflector stack comprises alternate layers of aluminum arsenide and aluminum gallium arsenide, said p-layer is p-doped aluminum gallium arsenide, said quantum well intrinsic region comprises alternating layers of aluminum gallium arsenide and gallium arsenide, and said n-layer comprises n-doped gallium arsenide.

7. A semiconductor integrated circuit according to claim 6 wherein the channel of said field effect transistor comprises a layer of n-doped gallium arsenide separated from a gate electrode by a spacer layer of aluminum gallium arsenide.

* * * * *